(12) United States Patent
Li et al.

(10) Patent No.: US 10,705,053 B2
(45) Date of Patent: Jul. 7, 2020

(54) THERMAL-PIEZORESISTIVE OSCILLATOR-BASED AEROSOL SENSOR AND AEROSOL SENSING METHOD

(71) Applicant: NATIONAL TSING HUA UNIVERSITY, Hsinchu (TW)

(72) Inventors: Sheng-Shian Li, Taoyuan (TW); Ting-Yuan Liu, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 219 days.

(21) Appl. No.: 15/970,859

(22) Filed: May 3, 2018

(65) Prior Publication Data
US 2019/0227034 A1 Jul. 25, 2019

(30) Foreign Application Priority Data
Jan. 19, 2018 (TW) .............................. 107102099 A

(51) Int. Cl.
*G01N 5/02* (2006.01)
*G01N 15/06* (2006.01)
(Continued)

(52) U.S. Cl.
CPC ........ *G01N 29/036* (2013.01); *G01N 29/2431* (2013.01); *H03B 5/30* (2013.01);
(Continued)

(58) Field of Classification Search
CPC ........ G01N 5/02; G01N 15/06; G01N 29/036; G01N 29/2431; G01N 2291/014;
(Continued)

(56) References Cited

U.S. PATENT DOCUMENTS 7,897,127 B2 * 3/2011 Layman .................... B22F 9/12
423/215.5
9,571,013 B2 * 2/2017 Rahafrooz ........... H03H 3/0072
(Continued)

FOREIGN PATENT DOCUMENTS

CN 103411864 A 11/2013
EP 2952875 A1 12/2015
TW M535318 U 1/2017

OTHER PUBLICATIONS

H. S. Wasisto et al., "Partially integrated cantilever-based airborne nanoparticle detector for continuous carbon aerosol mass concentration monitoring", Journal of Sensors and Sensor Systems, published in Mar. 11, 2015, vol. 4, issue 1, pp. 111-123, published by Copernicus Publications, Germany.

*Primary Examiner* — Nguyen Q. Ha
(74) *Attorney, Agent, or Firm* — CKC & Partners Co., LLC

(57) ABSTRACT

The present disclosure provides an aerosol sensing method. The aerosol sensing method includes steps of providing an entering process, providing a particle collecting process and providing a measuring process. The entering process is to allow an aerosol to enter a chamber of a thermal-piezoresistive oscillator-based aerosol sensor, and a thermal-piezoresistive resonator is disposed in the chamber. The particle collecting process is to allow particulate matters in the aerosol to land on at least one proof-mass of the thermal-piezoresistive resonator when the thermal-piezoresistive resonator is not driven. The measuring process is to use an electrical signal to drive the thermal-piezoresistive resonator and measure a resonant frequency of the thermal-piezoresistive resonator. The particle collecting process and the measuring process are operated in a repetitive cycle for measuring changes of the resonant frequency of the thermal- (Continued)

piezoresistive resonator to measure the particulate matters of the aerosol.

8 Claims, 19 Drawing Sheets

(51) Int. Cl.
  *G01N 29/036* (2006.01)
  *H03B 5/30* (2006.01)
  *G01N 29/24* (2006.01)
  *H03H 9/24* (2006.01)
  *H03H 9/02* (2006.01)

(52) U.S. Cl.
  CPC .......... *H03H 9/02259* (2013.01); *H03H 9/24* (2013.01); *H03H 9/2452* (2013.01); *H03H 9/2463* (2013.01); *G01N 2291/014* (2013.01); *G01N 2291/02425* (2013.01); *H03H 2009/0233* (2013.01); *H03H 2009/02251* (2013.01); *H03H 2009/02322* (2013.01); *H03H 2009/02385* (2013.01); *H03H 2009/241* (2013.01); *H03H 2009/2442* (2013.01)

(58) Field of Classification Search
  CPC .......... G01N 2291/02425; H03B 5/30; H03H 9/02259; H03H 9/24; H03H 9/2452; H03H 9/2463; H03H 2009/02251; H03H 2009/02322; H03H 2009/0233; H03H 2009/02385; H03H 2009/241; H03H 2009/2442
  See application file for complete search history.

(56) References Cited

U.S. PATENT DOCUMENTS

| | | | |
|---|---|---|---|
| 2007/0089519 A1 | 4/2007 | Hao et al. | |
| 2008/0068000 A1* | 3/2008 | Bargatin | G01N 29/036 324/76.11 |
| 2011/0084218 A1* | 4/2011 | Duhr | B01L 3/508 250/459.1 |
| 2014/0305191 A1* | 10/2014 | Schmid | G01N 29/022 73/24.03 |
| 2016/0047728 A1* | 2/2016 | Wilson | G01N 15/0255 73/24.03 |
| 2017/0097255 A1* | 4/2017 | Karakaya | G01G 3/16 |
| 2018/0099283 A1* | 4/2018 | Paprotny | G01N 5/00 |
| 2018/0328889 A1* | 11/2018 | Hansen | G01N 29/036 |
| 2019/0204205 A1* | 7/2019 | Hentz | G01H 13/00 |

* cited by examiner

US 10,705,053 B2

THERMAL-PIEZORESISTIVE OSCILLATOR-BASED AEROSOL SENSOR AND AEROSOL SENSING METHOD

RELATED APPLICATIONS

This application claims priority to Taiwan Application Serial Number 107102099, filed Jan. 19, 2018, which is herein incorporated by reference.

BACKGROUND

Technical Field

The present disclosure relates to an aerosol sensing sensor and an aerosol sensing method. More particularly, the present disclosure relates to a thermal-piezoresistive oscillator-based aerosol sensor and an aerosol sensing method using the same.

Description of Related Art

PM2.5 describes small particulate matters in the air, which is a main reason that induces the increase of respiratory tract infection, cardiovascular disease or lung adenocarcinoma. Most lung adenocarcinoma patients are women who do not smoke all their life, and cooking oil fume and air pollution which include particulate matters may be the possible cause. Lung adenocarcinoma is hardly detected, and a survival rate for people diagnosed with late-stage lung adenocarcinoma is low.

Conventional aerosol sending method includes Beta-ray absorption method and Tapered element oscillating microbalance (TEMO) method, but such aerosol sensing methods have disadvantages of high cost and large size. Additionally, aerosol sensors thereof are lack of portability.

Therefore, how to develop an aerosol sensing sensor with enhanced sensing ability and portability becomes a pursuit target for practitioners.

SUMMARY

The present disclosure provides an aerosol sensing method. The aerosol sensing method includes steps of providing an entering process, providing a particle collecting process and providing a measuring process. The entering process is to allow an aerosol to enter a chamber of a thermal-piezoresistive oscillator-based aerosol sensor, and a thermal-piezoresistive resonator is disposed in the chamber. The particle collecting process is to allow particulate matters in the aerosol to land on at least one proof-mass of the thermal-piezoresistive resonator when the thermal-piezoresistive resonator is not driven. The measuring process is to use an electrical signal to drive the thermal-piezoresistive resonator and measure a resonant frequency of the thermal-piezoresistive resonator. The particle collecting process and the measuring process are operated in a repetitive cycle for measuring changes of the resonant frequency of the thermal-piezoresistive resonator to measure the particulate matters of the aerosol.

The present disclosure provides a thermal-piezoresistive oscillator-based aerosol sensor which is for measuring the particulate matters of the aerosol by using the aerosol sensing method. The thermal-piezoresistive oscillator-based aerosol sensor includes a case and the thermal-piezoresistive resonator. The case includes an opening and the chamber. The chamber is communicated with the opening. The thermal-piezoresistive resonator is disposed inside the chamber and includes at least one thermal beam connected to the proof-mass. The proof-mass is resonated when the thermal beam is driven.

BRIEF DESCRIPTION OF THE DRAWINGS

The disclosure can be more fully understood by reading the following detailed description of the embodiments, with reference made to the accompanying drawings as follows.

DETAILED DESCRIPTION

It will be understood that when an element (or mechanism or module) is referred to as be "disposed on/at", "connected to" or "coupled to" another element, it can be directly disposed on/at, connected or coupled to the other element, or it can be indirectly disposed on/at, connected or coupled to the other element, that is, intervening elements may be present. In contrast, when an element is referred to as be "directly disposed on/at", "directly connected to" or "directly coupled to" another element, there are no intervening elements present.

In addition, the terms first, second, third, etc. are used herein to describe various elements or components, these elements or components should not be limited by these terms. Consequently, a first element or component discussed below could be termed a second element or component.

Figure 1:
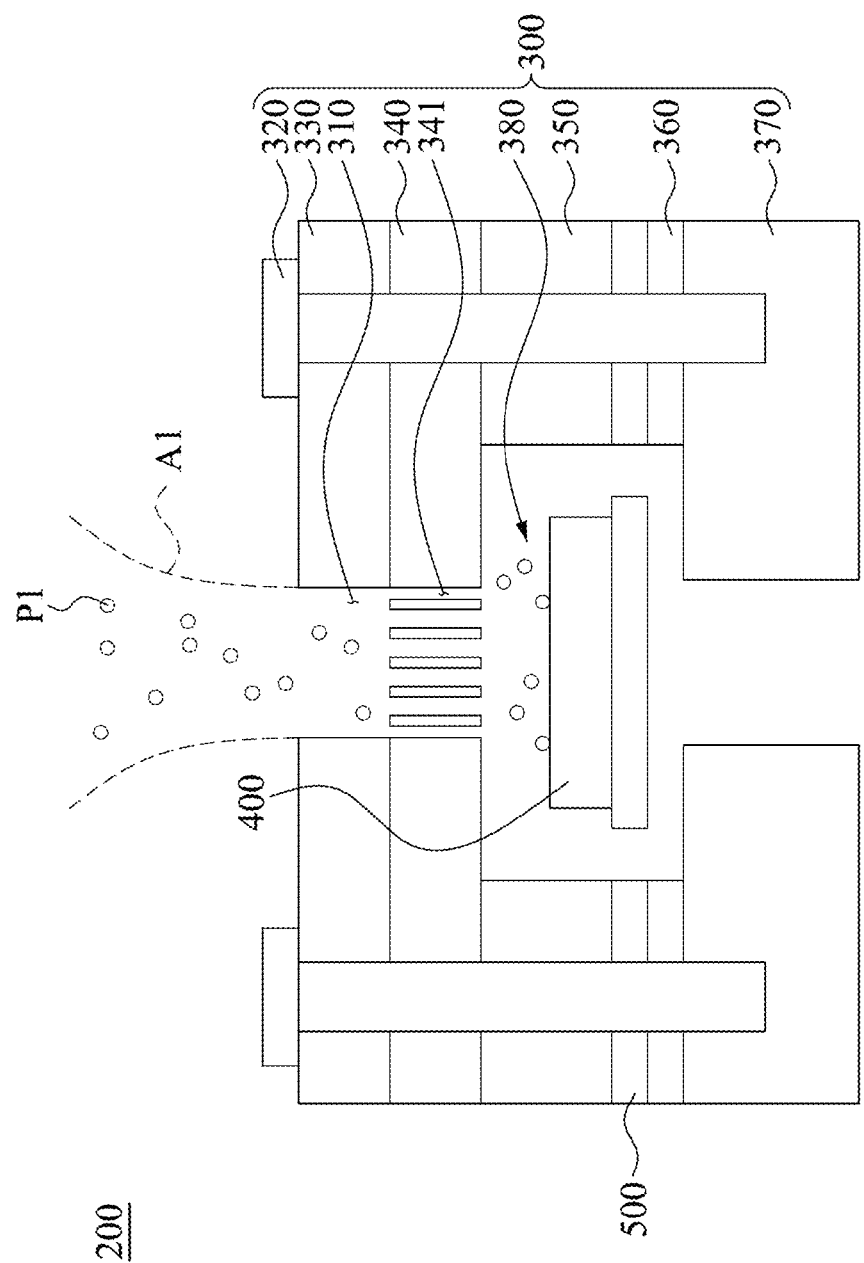
FIG. 1 shows a cross-sectional view of a thermal-piezoresistive oscillator-based aerosol sensor according to one embodiment of the present disclosure.
Figure 2:
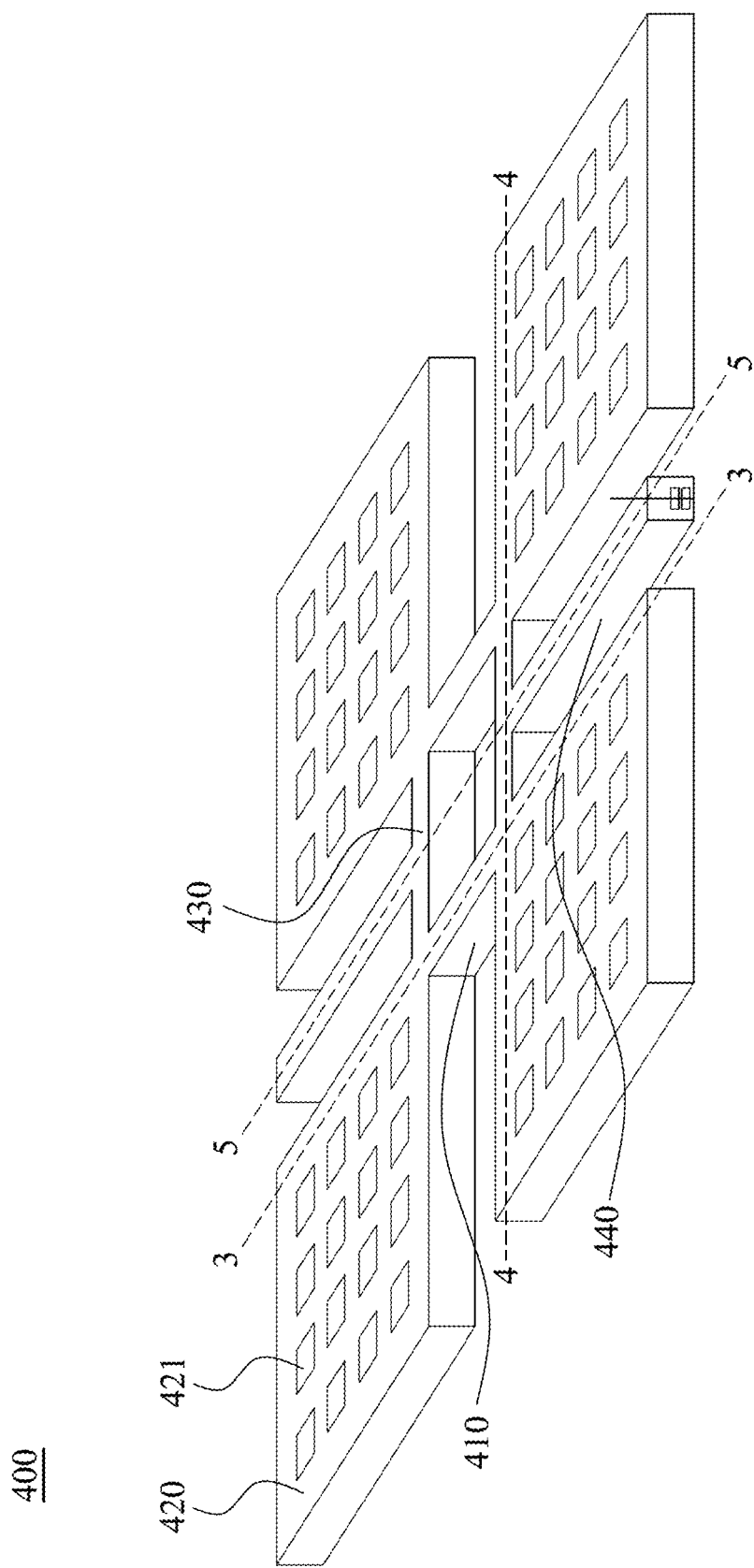
FIG. 2 shows a schematic view of a thermal-piezoresistive resonator of the thermal-piezoresistive oscillator-based aerosol sensor of FIG. 1.
Figure 3:
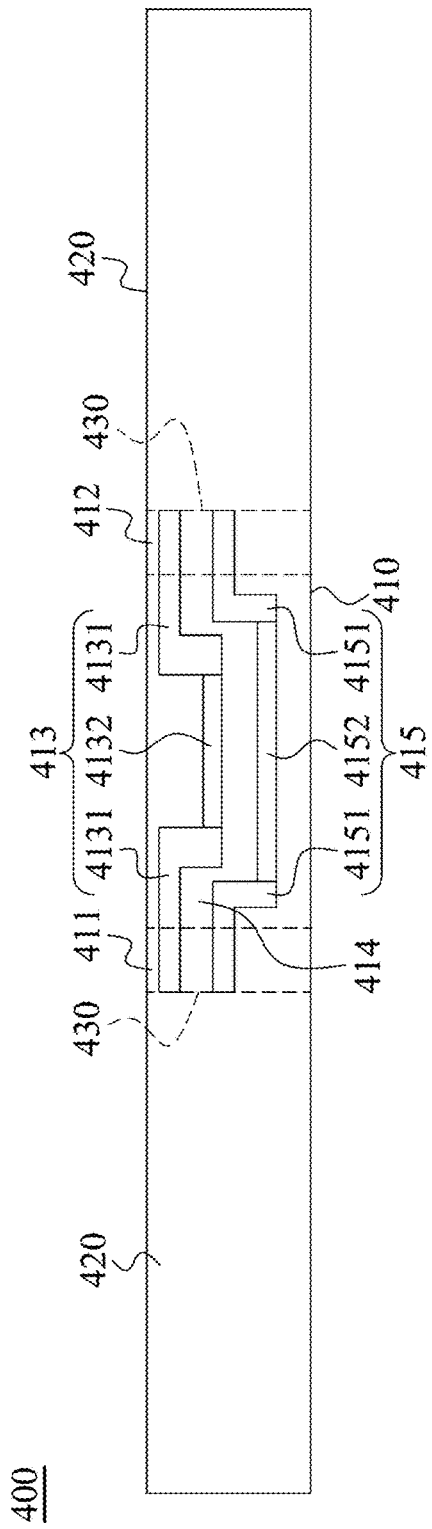
FIG. 3 shows a cross-sectional view of the thermal-piezoresistive resonator taken along line 3-3 of FIG. 2.
Figure 4:
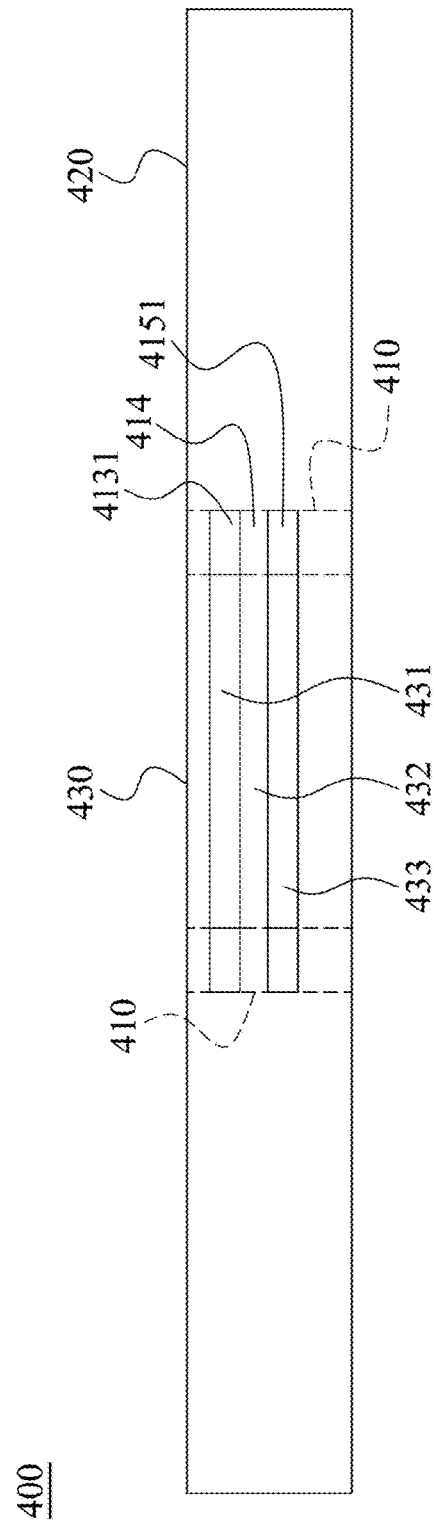
FIG. 4 shows another cross-sectional view of the thermal-piezoresistive resonator taken along line 4-4 of FIG. 2.
Figure 5:
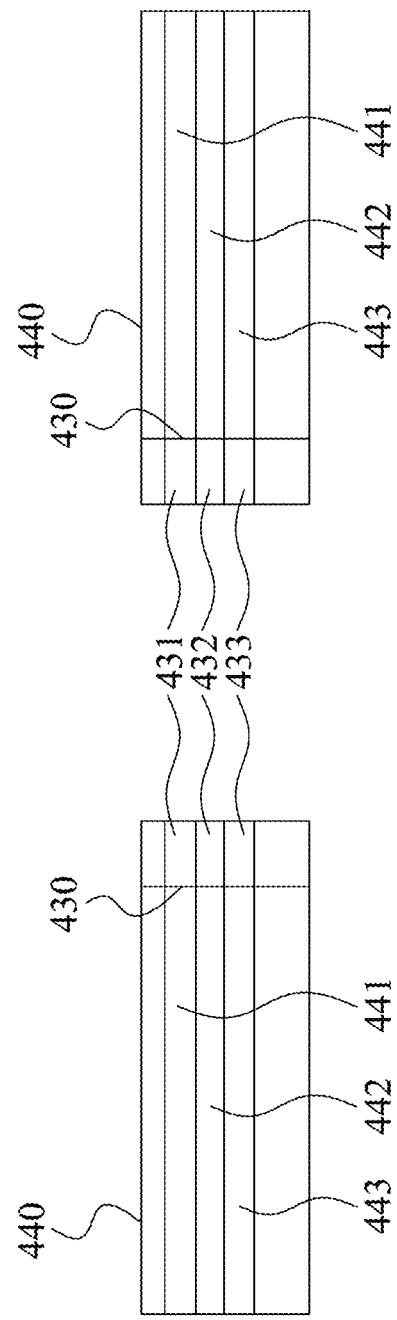
FIG. 5 shows yet another cross-sectional view of the thermal-piezoresistive resonator taken along line 5-5 of FIG. 2.

FIG. 1 shows a cross-sectional view of a thermal-piezoresistive oscillator-based aerosol sensor 200 according to one embodiment of the present disclosure. FIG. 2 shows a schematic view of a thermal-piezoresistive resonator 400 of the thermal-piezoresistive oscillator-based aerosol sensor 200 of FIG. 1. FIG. 3 shows a cross-sectional view of the thermal-piezoresistive resonator 400 taken along line 3-3 of FIG. 2. FIG. 4 shows another cross-sectional view of the thermal-piezoresistive resonator 400 taken along line 4-4 of FIG. 2. FIG. 5 shows yet another cross-sectional view of the thermal-piezoresistive resonator 400 taken along line 5-5 of FIG. 2. Refer to FIGS. 1 to 5, the thermal-piezoresistive oscillator-based aerosol sensor 200 includes a case 300 and a thermal-piezoresistive resonator 400.

The case 300 includes an opening 310 and a chamber 380. The chamber 380 is communicated with the opening 310. The thermal-piezoresistive resonator 400 is disposed inside the chamber 380 and includes at least one thermal beam 410 connected to a proof-mass 420. The proof-mass 420 is resonated when the thermal beam 410 is driven.

Therefore, the particulate matters P1 can be sensed through measuring changes of a resonant frequency of the thermal-piezoresistive resonator 400. The thermal-piezoresistive oscillator-based aerosol sensor 200 will be described in detail in the following paragraphs.

In the embodiment, the case 300 includes a top 330, a ring frame 350 and a base 370. The opening 310 is positioned at the top 330. The ring frame 350 and the base 370 are assembled to form the chamber 380. The opening 310 is for the aerosol A1 to flow into the chamber 380 and the particulate matters P1 in the aerosol A1 will land on the thermal-piezoresistive resonator 400. The case 300 can further include an elastic body 360 on which the thermal-piezoresistive resonator 400 can be disposed, and reactions occurred by the thermal-piezoresistive resonator 400 can be absorbed by the elastic body 360 when the thermal-piezoresistive resonator 400 is resonated.

The case 300 can further include an impactor 340. The impactor 340 includes a plurality of holes 341 communicated with the opening 310 and the chamber 380. Through the configuration of the impactor 340, the aerosol A1 flows into the chamber 380 quickly owning to the Bernoulli's principle, which is helpful for the particulate matters P1 to land on the thermal-piezoresistive resonator 400.

In the thermal-piezoresistive resonator 400, a number of thermal beam 410 is two and each of the two thermal beams 410 includes a first end 411 and a second end 412. The thermal-piezoresistive resonator 400 further includes two mechanical beams 430 perpendicular to the thermal beams 410. One of the mechanical beams 430 is connected between the first end 411 of one of the thermal beams 410 and the first end 411 of the other one of the thermal beams 410, and the other one of the mechanical beams 430 is connected between the second end 412 of one of the thermal beams 410 and the second end 412 of the other one of the thermal beams 410, such that a rectangle frame structure is formed. Moreover, a number of the proof-mass 420 is four, and the four proof-masses 420 are connected to the two first ends 411 and the two second ends 412 of the two thermal beams 410, respectively. In other embodiment (not shown), the thermal-piezoresistive resonator can include two thermal beams and two proof-masses, and the two thermal beams which are parallel are spaced apart from each other. The thermal-piezoresistive resonator can resonate in a bulk acoustic mode when the thermal-piezoresistive resonator is driven, and the present disclosure is not limited thereto.

The thermal-piezoresistive oscillator-based aerosol sensor 200 further includes a circuit board 500 configured for the thermal-piezoresistive resonator 400 to be disposed. When assembling, the base 370, the elastic body 360, the circuit board 500, the ring frame 350, the impactor 340 and the top 330 are assembled sequentially to be fastened by a bolt 320. In other embodiment, the case 300 can be assembled by engaging method, and the components of the case 300 are not limited to the base 370, the elastic body 360, the ring frame 350, the impactor 340 and the top 330. The case can be consisted of two semi-bodies, and limited portions configured for the circuit board and the thermal-piezoresistive resonator to be disposed are included in the semi-bodies. The assembly can be completed by combining the two semi-bodies, but the present disclosure is not limited thereto.

Please be noted that in order to allow the aerosol A1 to flow into and flow out from the thermal-piezoresistive oscillator-base aerosol sensor 200, a hole (not labeled) is formed at the base 370, and a plurality of air channels (not labeled) can be disposed on the circuit board 500 for the aerosol A1 to pass through.

As shown in FIG. 2, the thermal-piezoresistive resonator 400 is made by CMOS-MEMS technique, and the thermal-piezoresistive resonator 400 is a butterfly-shaped resonator. The two thermal beams 410 and the two mechanical beams 430 are connected to form a hollow rectangle frame, and the four proof-masses 420 are connected to four corners of the rectangle frame, respectively. Each of the proof-masses 420 is substantially rectangle-shaped and includes a plurality of through holes 421 spaced apart from each other. Through the configuration of the through holes 421, the manufacturing yield can be improved. Please be noted that the manufacturing details of the CMOS-MEMS technique are not the key points of the present disclosure, and will not be described.

As shown in FIG. 3, each of the thermal beams 410 can include a first oxide layer 414, a first lower layer 415 and a first upper layer 413. The first oxide layer 414 includes a first upper surface (not labeled) and a first lower surface (not labeled) opposite to the first upper surface. The first lower layer 415 is disposed on the first lower surface and includes a first poly region 4152 and two first metal regions 4151. Each of the first metal regions 4151 has a first distal end (not labeled) and a first proximate end (not labeled). The two first proximate ends are connected to two ends of the first poly region 4152, respectively. The first upper layer 413 is disposed on the first upper surface and includes a second poly region 4132 and two second metal regions 4131. Each of the second metal regions 4131 has a second distal end and a second proximate end, and the two second proximate ends connected to the two ends of the second poly region 4132, respectively.

Each of the first oxide layer 414, the first lower layer 415 and the first upper layer 413 is a thin-film structure. The first oxide layer 414 is made of oxide silicon. The first poly region 4152 and the second poly region 4132 are made of polysilicon, and doping concentrations of the first poly region 4152 and the second poly region 4132 are different. The first poly region 4152 is served as a thermal actuator and the second poly region 4132 is served as a piezoresistive sensing terminal. Additionally, the first metal region 4151 and the second metal region 4131 can be made by the same or different conducting materials.

Each of the mechanical beams 430 can include a second oxide layer 432, a second lower layer 433 and a second upper layer 431. The second oxide layer 432 includes a second upper surface (not labeled) and a second lower surface (not labeled) opposite to the second upper surface. The second lower layer 433 is disposed on the second lower surface, and two ends of the second lower layer 433 are connected to the two first distal ends, respectively. The second upper layer 431 is disposed on the second upper surface, and two ends of the second upper layer 431 are connected to the two second distal ends, respectively.

Each of the second oxide layer 432, the second lower layer 433 and the second upper layer 431 is a thin-film structure. The second oxide layer 432 is made of oxide silicon. The second lower layer 433 is made of a material which is the same with the material of the first metal region 4151. The second upper layer 432 is made of a material which is the same with the material of the second metal region 4131. Based on the above connecting relationship, the second lower layer 433 can be electrically connected to the first metal region 4151, and the second upper layer 431 can be electrically connected to the second metal region 4131.

Preferably, the thermal-piezoresistive resonator 400 can further include a substrate (no shown) and two fixing beams 440. Each of the fixing beams 440 is perpendicular to the mechanical beam 430. One of the fixing beams 440 is connected between the substrate and one of the mechanical beams 430, and the other of the fixing beams 440 is connected between the substrate and the other one of the mechanical beams 430, such that the proof-mass 420 is suspended from the substrate. Each of the fixing beams 440 includes a third oxide layer 442, a third lower layer 443 and a third upper layer 441. The third oxide layer 442 includes a third upper surface (not labeled) and a third lower surface (not labeled) opposite to the third upper surface. The third lower layer 443 is disposed on the third lower surface, and the third lower layer 443 is connected to the second lower layer 433. The third upper layer 441 is disposed on the third upper surface, and the third upper layer 441 is connected to the second upper layer 431.

Each of the third oxide layer 442, the third lower layer 443 and the third upper layer 441 is a thin-film structure. The third oxide layer 442 is made of oxide silicon. The third lower layer 443 is made of a material which is the same with the material of the second lower layer 433 and the material of the first metal region 4151. The third upper layer 441 is made of a material which is the same with the material of the second upper layer 431 and the material of the second metal region 4131. Based on the above connecting relationship, the third lower layer 443 and the second lower layer 433 can be electrically connected to the first metal region 4151, and the third upper layer 441 and the second upper layer 431 can be electrically connected to the second metal region 4131. Furthermore, one end of each of the third lower layer 443 of the fixing beam 440, which is far away from the second lower layer 433 and is the end of the fixing beam 440 connected to the substrate, can be served as a signal input terminal, and one end of each of the third upper layer 441 of the fixing beam 440, which is far away from the second upper layer 431 and is the end of the fixing beam 440 connected to the substrate, can be served as a sensing output terminal.

When exciting the thermal-piezoresistive resonator 400, the thermal-piezoresistive resonator 400 is actuated by an electric signal. Through the electrocaloric effect, the thermal-piezoresistive resonator 400 is thermally expanded to form a mechanical force to generate a structure deformation; thus, the sensing terminal will output a small voltage signal at a resonant frequency owing to resistance changes occurred by the piezoresistance effect thereof. The small voltage signal can be inputted into a lock-in amplifier, and the lock-in amplifier can lock the resonant frequency and generate a swing signal at the same frequency.

Through the configuration of the mechanical beams 430, the proof-masses 420 which are spaced apart from each other can resonate simultaneously, which can decrease the resistance of the thermal-piezoresistive resonator 400. Additionally, through the metal-line configuration of the first metal region 4151, the second metal region 4131, the second upper layer 431, the second lower layer 433, the third upper layer 441 and the third lower layer 443, an efficiency factor η of the voltage input simulated by the COMSOL tool is 0.92; as a result, the transconductance of the thermal-piezoresistive resonator 400 is increased. $\eta=V_B/V_A$. $V_B$ represents the voltage difference between the two first ends 411 of the same thermal beam 410, and $V_A$ represents the voltage difference between the two input terminals. In addition, in order to improve the transconductance, the thermal beam 410 can be scaled down to decrease the thermal-capacitance which is related to the length of the thermal beam 410 to increase the transconductance of the thermal-piezoresistive resonator 400. The transconductance is related to the efficiency factor n, the thermal-capacitance, the length of the thermal beam 410 and the angle frequency.

Figure 6B:
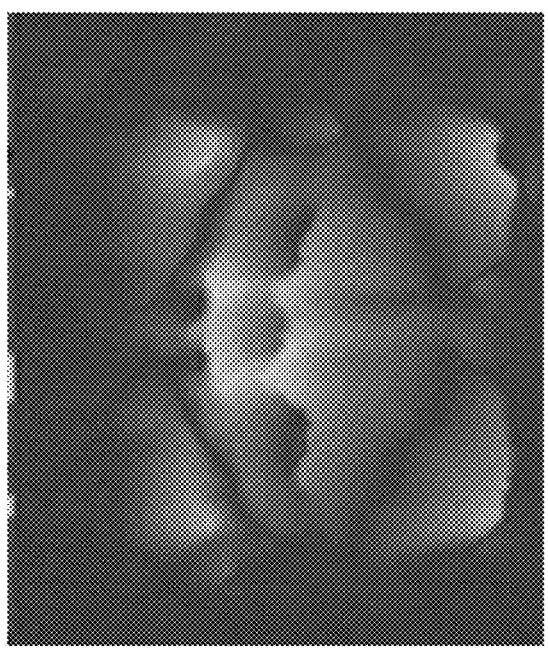
FIG. 6B shows a LDV measuring result of the thermal-piezoresistive resonator of FIG. 6A.
Figure 6A:
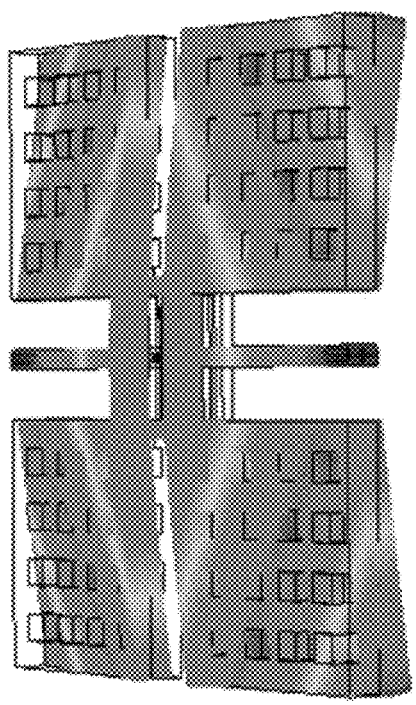
FIG. 6A shows one simulated vibration of the thermal-piezoresistive resonator of FIG. 2.
Figure 7B:
FIG. 7B shows a LDV measuring result of the thermal-piezoresistive resonator of FIG. 7A.
Figure 7A:
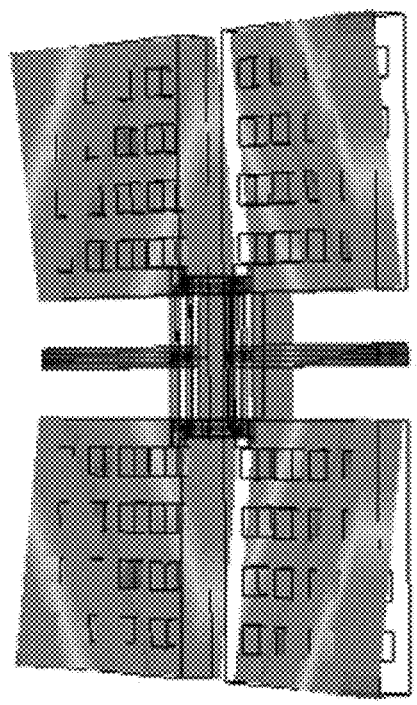
FIG. 7A shows another simulated vibration of the thermal-piezoresistive resonator of FIG. 2.
Figure 8B:
FIG. 8B shows a LDV measuring result of the thermal-piezoresistive resonator of FIG. 8A.
Figure 8A:
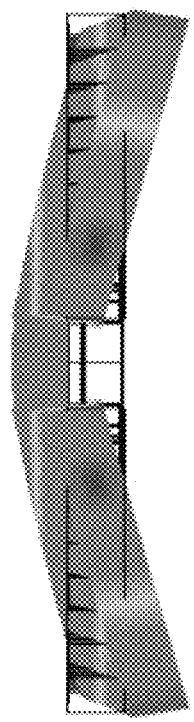
FIG. 8A shows yet another simulated vibration of the thermal-piezoresistive resonator of FIG. 2.
Figure 9B:
FIG. 9B shows a LDV measuring result of the thermal-piezoresistive resonator of FIG. 9A.
Figure 9A:
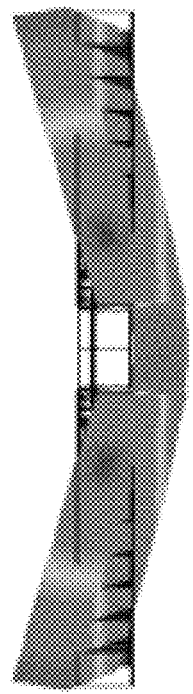
FIG. 9A shows still yet another simulated vibration of the thermal-piezoresistive resonator of FIG. 2.

FIG. 6A shows one simulated vibration of the thermal-piezoresistive resonator 400 of FIG. 2. FIG. 6B shows a LDV measuring result of the thermal-piezoresistive resonator 400 of FIG. 6A. FIG. 7A shows another simulated vibration of the thermal-piezoresistive resonator 400 of FIG. 2. FIG. 7B shows a LDV measuring result of the thermal-piezoresistive resonator 400 of FIG. 7A. FIG. 8A shows yet another simulated vibration of the thermal-piezoresistive resonator 400 of FIG. 2. FIG. 8B shows a LDV measuring result of the thermal-piezoresistive resonator 400 of FIG. 8A. FIG. 9A shows still yet another simulated vibration of the thermal-piezoresistive resonator 400 of FIG. 2. FIG. 9B shows a LDV measuring result of the thermal-piezoresistive resonator 400 of FIG. 9A. As shown in FIGS. 6A to 9B, the thermal-piezoresistive resonator 400 can resonate in flexural mode when the thermal-piezoresistive resonator 400 is driven.

Figure 10B:
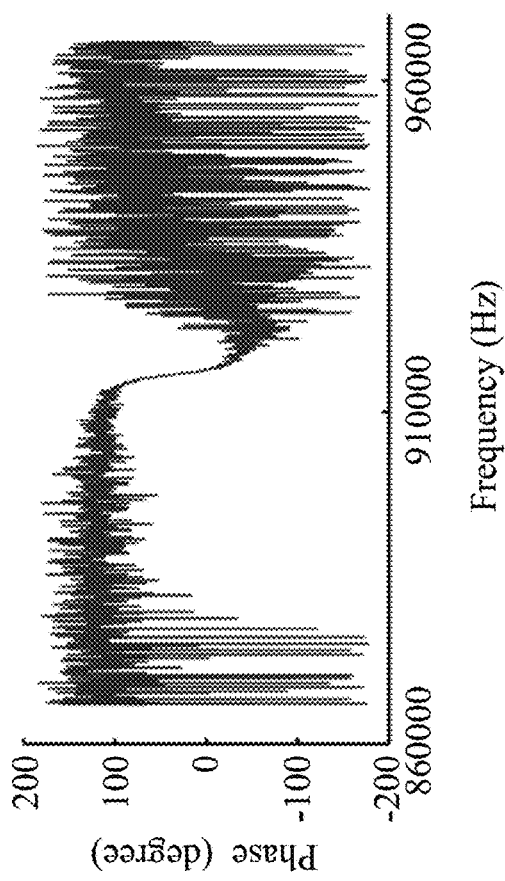
FIG. 10B shows a phase measuring result of FIG. 10A.
Figure 10A:
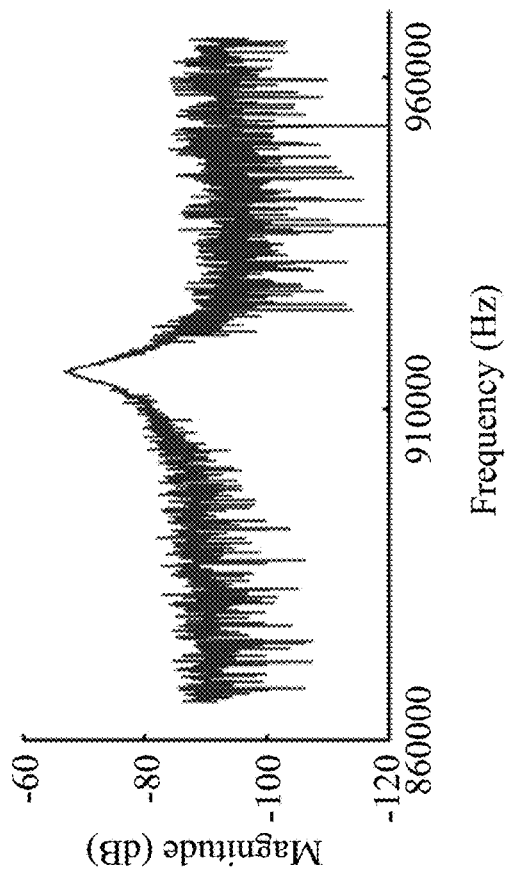
FIG. 10A shows one measuring result of $S_{21}$ of the thermal-piezoresistive resonator of FIG. 2 via a network vector analyzer.
Figures 11A, 11B:
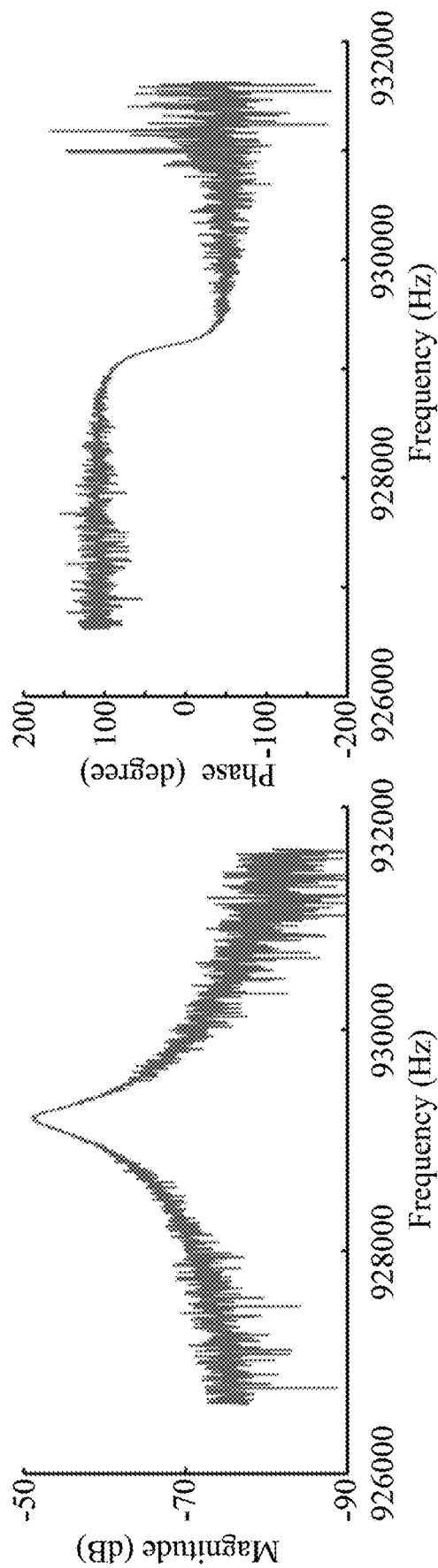
FIG. 11A shows another measuring result of $S_{21}$ of the thermal-piezoresistive resonator of FIG. 2 via the network vector analyzer.
FIG. 11B shows a phase measuring result of FIG. 11A.
Figure 12:
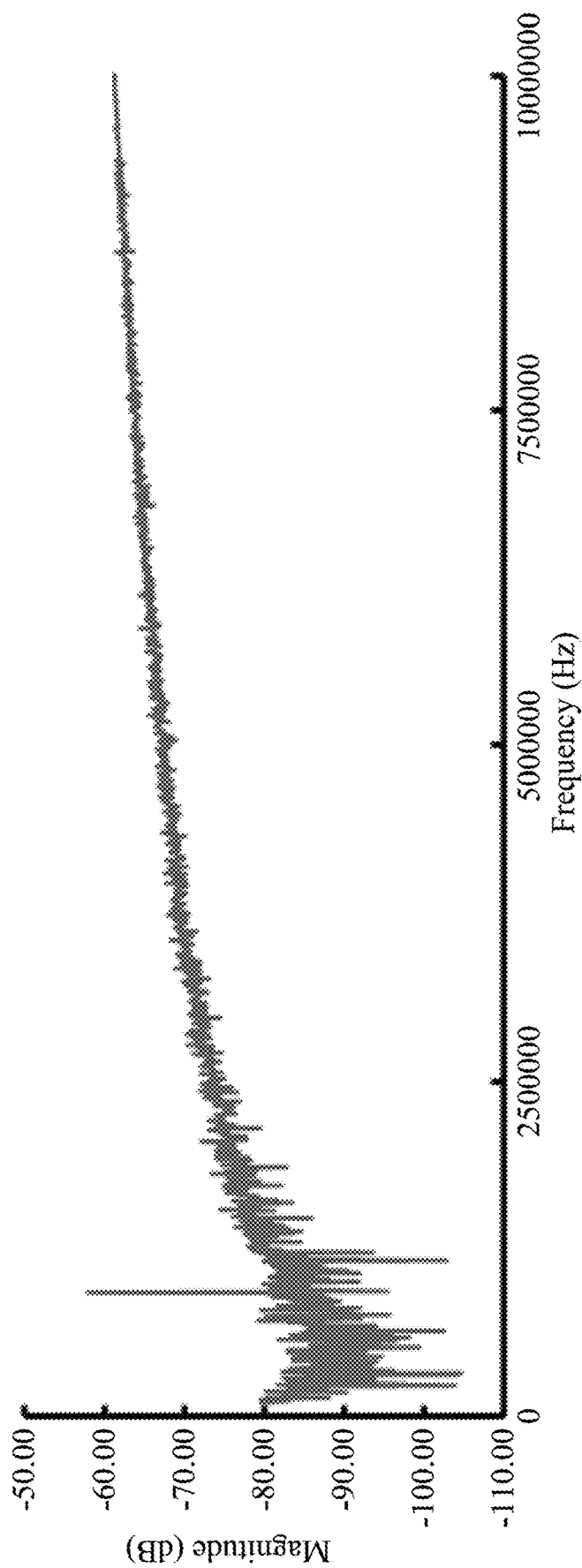
FIG. 12 shows a frequency sweep result of the thermal-piezoresistive resonator of FIG. 2.

FIG. 10A shows one measuring result of $S_{21}$ of the thermal-piezoresistive resonator 400 of FIG. 2 via a network vector analyzer. FIG. 10B shows a phase measuring result of FIG. 10A. FIG. 11A shows another measuring result of $S_{21}$ of the thermal-piezoresistive resonator 400 of FIG. 2 via the network vector analyzer. FIG. 11B shows a phase measuring result of FIG. 11A. FIG. 12 shows a frequency sweep result of the thermal-piezoresistive resonator 400 of FIG. 2.

Refer to FIGS. 10A to 12, when measuring, an alternative signal is given to a splitter from the network vector analyzer. The splitter provides input small signals with 0 degree and 180 degrees to reduce the effect of the common mode noise. The input small signals are combined with director currents from a power supply by a bais-tee to form the electric signal for inputting the thermal-piezoresistive resonator 400. Signals will be sent back to the network vector analyzer by the sensing terminal such that the resonant frequency of the thermal-piezoresistive resonator 400 can be found.

As shown in FIGS. 10A and 10B, the thermal-piezoresistive resonator 400 is measured in air. A stopband rejection is 20 dB, and a quality factor is 600 at 915 kHz. The dissipated power is 164 mW. As shown in FIGS. 11A and 11B, the thermal-piezoresistive resonator 400 is measured in vacuum, and the stopband rejection is 30 dB, and a quality factor is 5468 at 929 kHz. The dissipated power is 164 mW. As show in FIG. 12, after the resonant frequency analyzing, frequency sweep is conducted. The signal of the thermal-piezoresistive resonator 400 is strong and no spurious mode with equal strength occurs in 0~10 MHz.

The Y-parameter can be transferred via ADS such that the transconductance of 18 $\mu$A/V in air and 118 $\mu$A/V in vacuum are obtained. Therefore, high F-factor (the resistance of the thermal beam divided by the resistance of the thermal-piezoresistive resonator), low resonant frequency, and reduced thermal beam and thermal-capacitance can increase the transconductance of the thermal-piezoresistive resonator 400.

Additionally, the thermal-piezoresistive resonator 400 can be measured via the lock-in amplifier combined with a phase-locked loop, and the output signal of the lock-in amplifier is analyzed by a frequency counter; consequently, Allan deviation can be get via converting the data from the frequency counter by Matlab. The Allan deviation is 89 ppb at integral time 1 second in air. The frequency resolution is 0.082 Hz, and the mass resolution is 24 fg, which are excellent. Hence, the thermal-piezoresistive resonator 400 can sense the mass whose weight is 40 times lighter than single PM1, and the thermal-piezoresistive resonator 400 of the present disclosure can be used to sense fine particulate matters.

Figure 13:
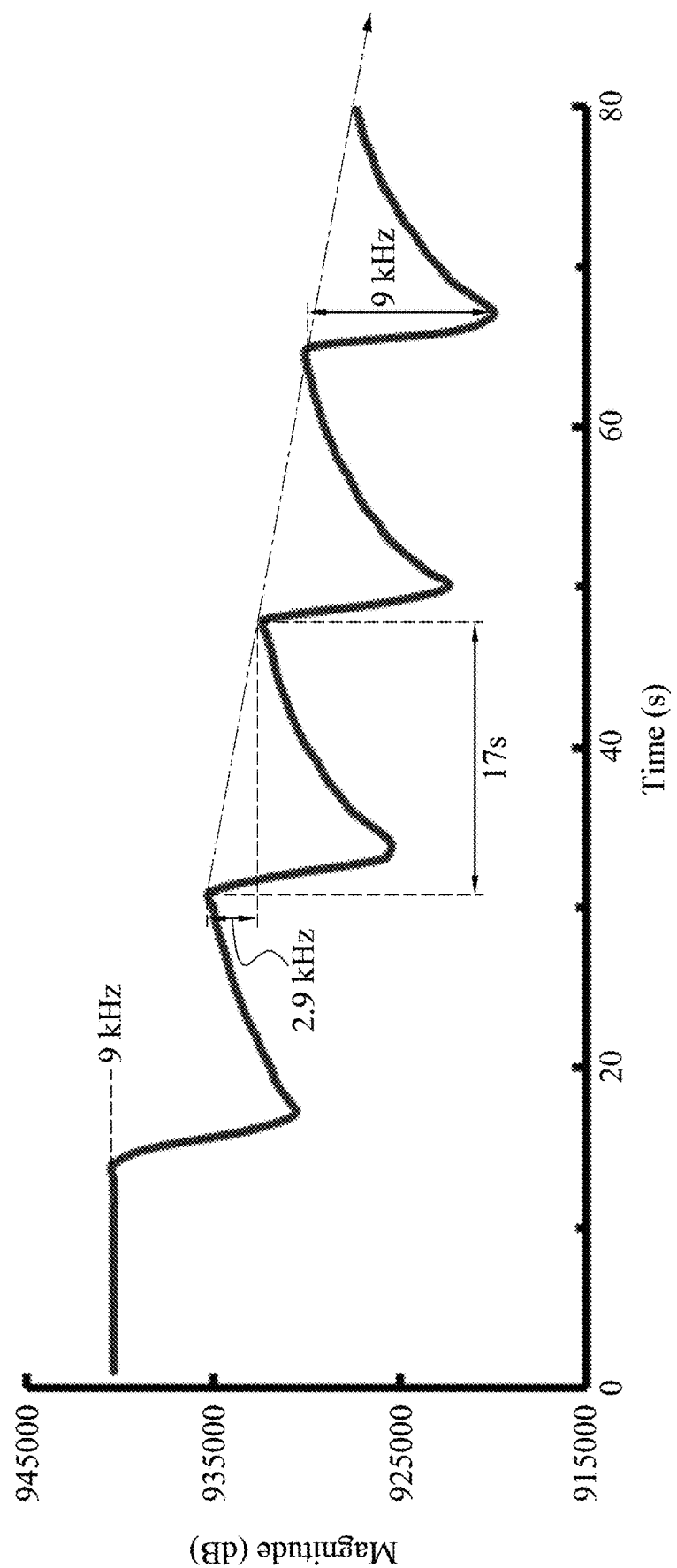
FIG. 13 shows a nano-inkjet printed measuring result of the thermal-piezoresistive resonator of FIG. 2.

FIG. 13 shows a nano-inkjet printed measuring result of the thermal-piezoresistive resonator 400 of FIG. 2. Refer to FIG. 13, the frequency of the thermal-piezoresistive resonator 400 can be measured after a pico-ink is injected. After four times injection, the frequency shifts about 9 kHz per pico-liter, and the variation of the frequency, decreasing 2.9 kHz in a period of 17 seconds, is linear. Accordingly, the sensing resolution is defined as 1.9463 Hz/pg because the weight of 1 pico-liter is 1.49 ng. Therefore, the frequency variation can be used to estimate the particulate matters.

Figures 14A, 14B:
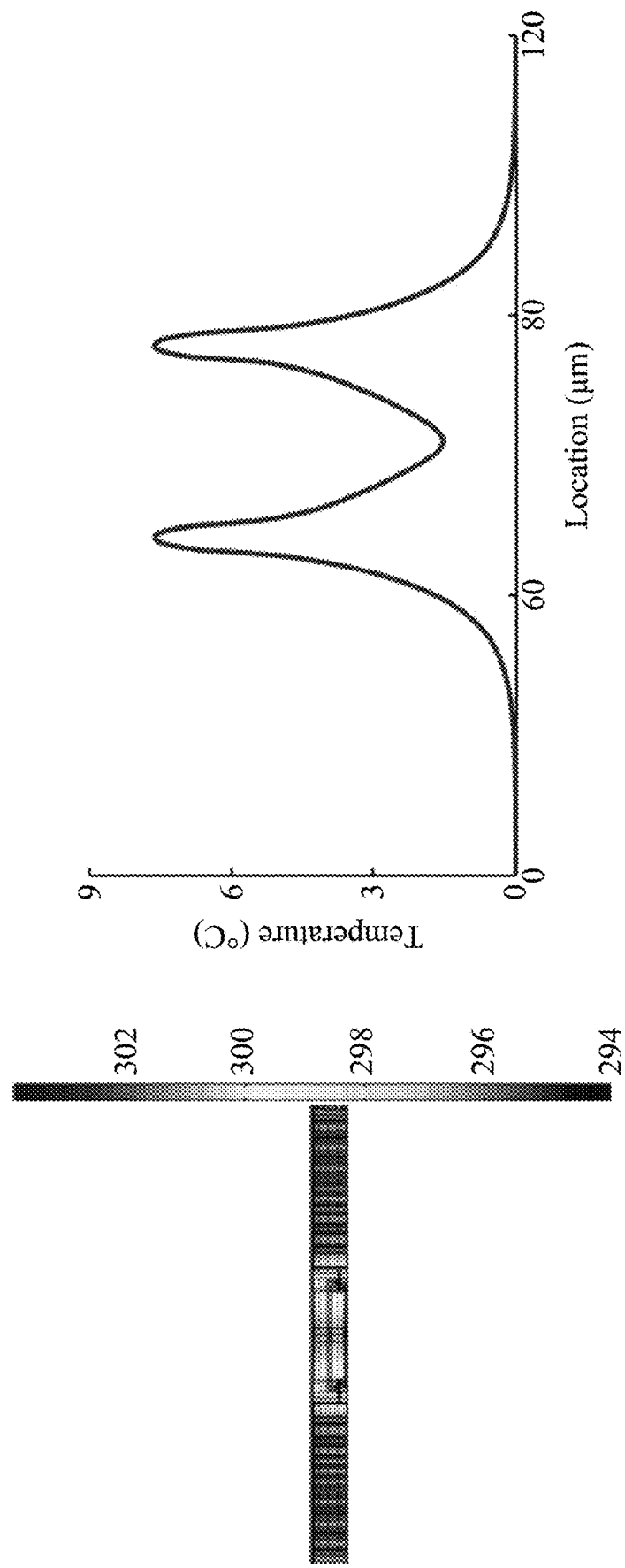
FIG. 14A shows a temperature measuring result of the thermal-piezoresistive resonator of FIG. 2.
FIG. 14B shows a temperature curve of FIG. 14A.

FIG. 14A shows a temperature measuring result of the thermal-piezoresistive resonator 400 of FIG. 2. FIG. 14B shows a temperature curve of FIG. 14A. Refer to FIG. 14A, the temperature is measured taken along line 4-4 of the thermal-piezoresistive resonator 400 of FIG. 2. As shown in FIGS. 14A and 14B, the temperature of the thermal beam 410 raises 8° C., and the temperature of the proof-mass 420 is constant, which are commonly seen in any kind of thermal-piezoresistive resonators.

Figure 15:
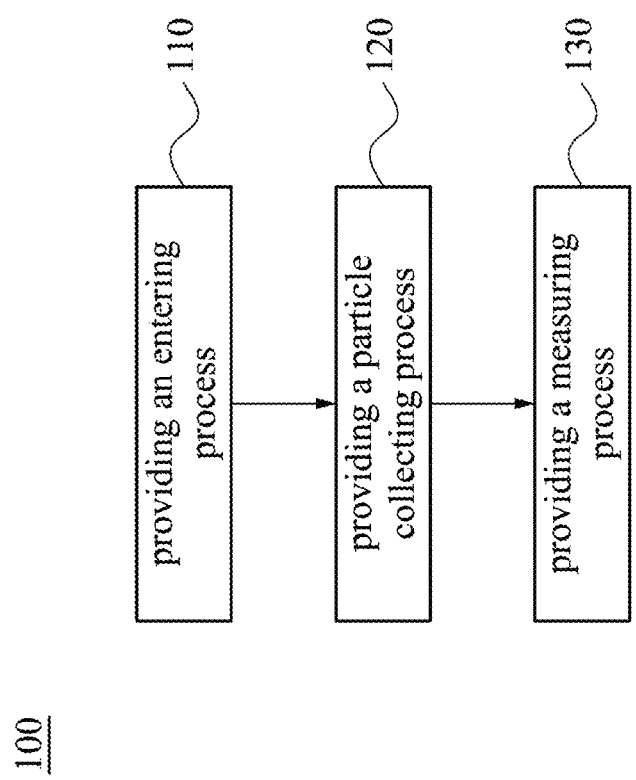
FIG. 15 shows a flow chart of an aerosol sensing method according to another embodiment of the present disclosure.
Figure 16:
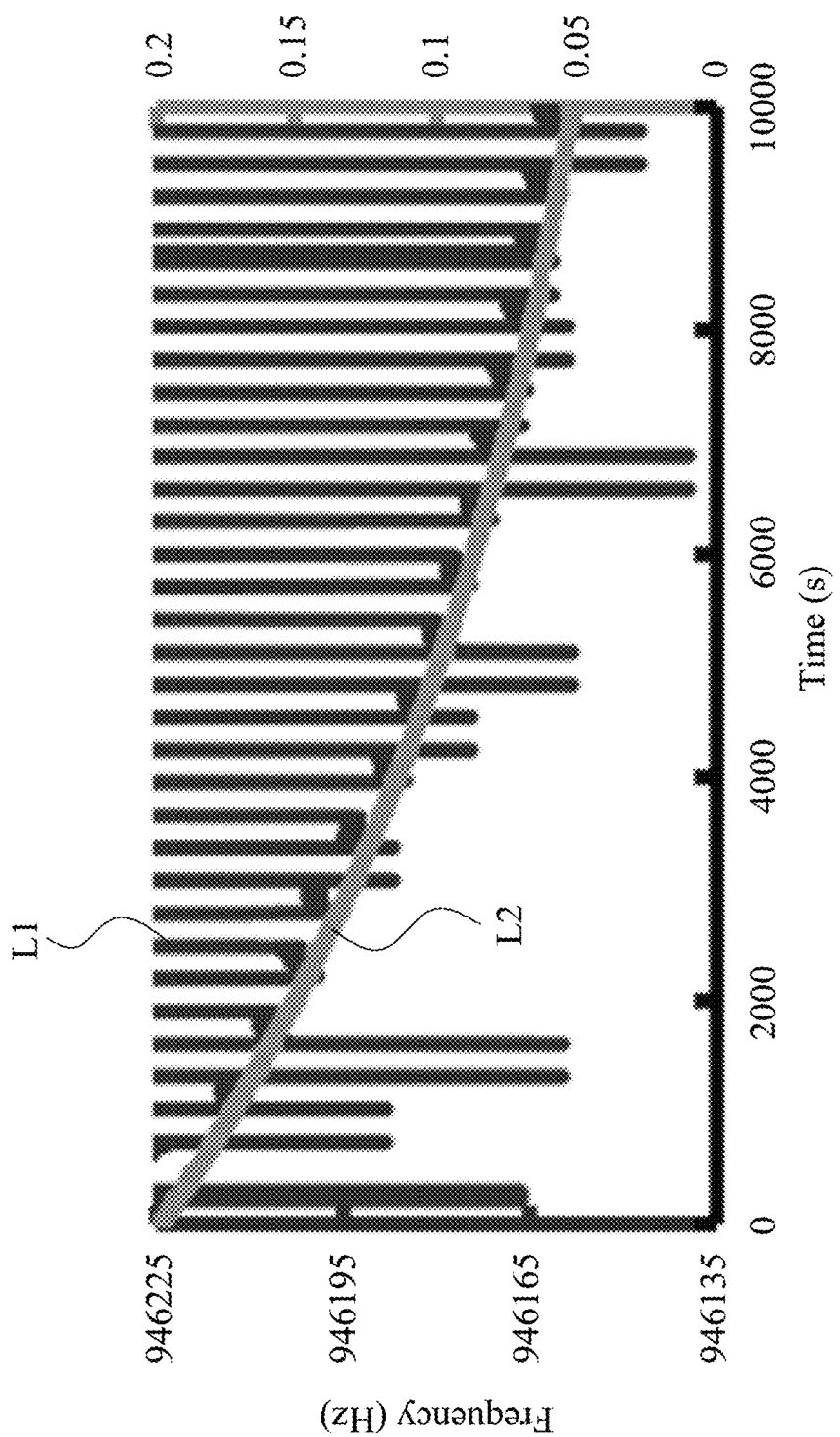
FIG. 16 shows a sensing result of the aerosol sensing method of FIG. 15.

Because the temperature of the thermal-piezoresistive is raised when exciting, the present disclosure provides an aerosol sensing method 100 to be adapted for any kind of thermal-piezoresistive oscillator-based sensor including the thermal-piezoresistive resonator. FIG. 15 shows a flow chart of an aerosol sensing method 100 according to another embodiment of the present disclosure. FIG. 16 shows a sensing result of the aerosol sensing method 100 of FIG. 15. Refer to FIGS. 15 and 16, the aerosol sensing method 100 includes Step 110, Step 120 and Step 130.

In Step 110, an entering process is provided to allow the aerosol A1 to enter the chamber 380 of the thermal-piezoresistive oscillator-based aerosol sensor 200. The thermal-piezoresistive resonator 400 is disposed in the chamber.

In Step 120, a particle collecting process is provided to allow particulate matters P1 in the aerosol A1 to land on at least one proof-mass 420 of the thermal-piezoresistive resonator 400 when the thermal-piezoresistive resonator 400 is not driven.

In Step 130, a measuring process is provided to use an electrical signal (not shown) to drive the thermal-piezoresistive resonator 400 and measure a resonant frequency of the thermal-piezoresistive resonator 400.

The particle collecting process and the measuring process are operated in a repetitive cycle for measuring changes of the resonant frequency of the thermal-piezoresistive resonator 400 to measure the particulate matters P1 of the aerosol A1.

Therefore, the thermophoresis effect of the thermal-piezoresistive resonator 400 which hinders the landing of the particulate matters P1 can be regulated.

In Step 110, a micro pump can be used to accelerate the aerosol A1, which can assist the aerosol A1 to enter the chamber 380 and increase the chance for the aerosol A1 to impact and land the proof-mass 420.

And in Step 120 and Step 130, the thermal-piezoresistive resonator 400 can be enabled or disabled. When the thermal-piezoresistive resonator 400 is disabled, the thermal beam 410 is not actuated and the temperature is not raised; thus, the particulate matters P1 can land on the proof-mass 420. On the other hand, when the thermal-piezoresistive resonator 400 is enabled, the thermal-piezoresistive resonator 400 will resonate in the way shown in FIGS. 6A and 7A at a resonant frequency, and the resonant frequency will change following the weight changes of the proof-mass 420 where the particulate matters P1 continuously accumulate. Hence, through measuring the changes of the resonant frequency of the thermal-piezoresistive resonator 400, the concentration of the particular matters can be known. Please be noted that the term "enable" represents that the thermal-piezoresistive resonator 400 is driven or excited to allow resonating, and the term "disable" represents that the thermal-piezoresistive resonator 400 is not driven or excited.

Refer to FIG. 16, line L1 shows changes of the resonant frequency of the thermal-piezoresistive resonators 400, and line 2 shows an aerosol measuring result at the same time via optical aerosol sensor (OAS). As shown in FIG. 16, the concentration of the particulate matters from 50 $\mu$g/m$^3$~200 $\mu$g/m$^3$ are measured by using the aerosol sensing method 100 of the present disclosure. It is proved that using the aerosol sensing method 100 to operate the thermal-piezoresistive oscillator-based aerosol sensor has a good measuring result because the slope of line L1 is the same as the slope of line L2.

Figure 17:
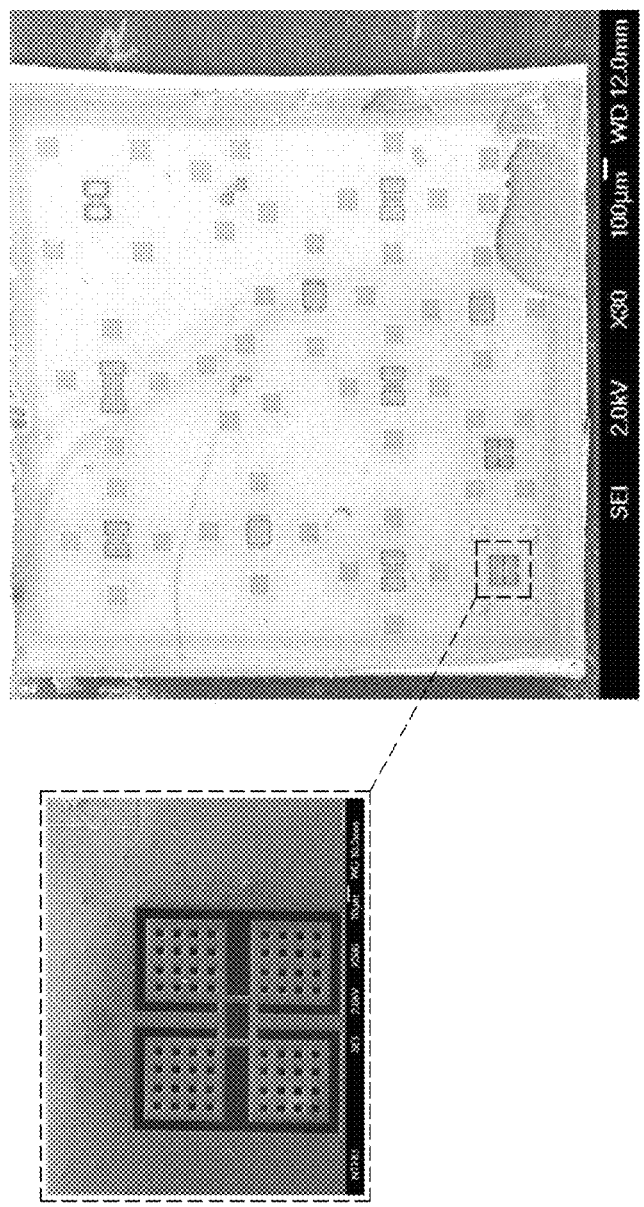
FIG. 17 shows one SEM image of a thermal-piezoresistive resonator of the aerosol sensing method of FIG. 15.
Figure 18:
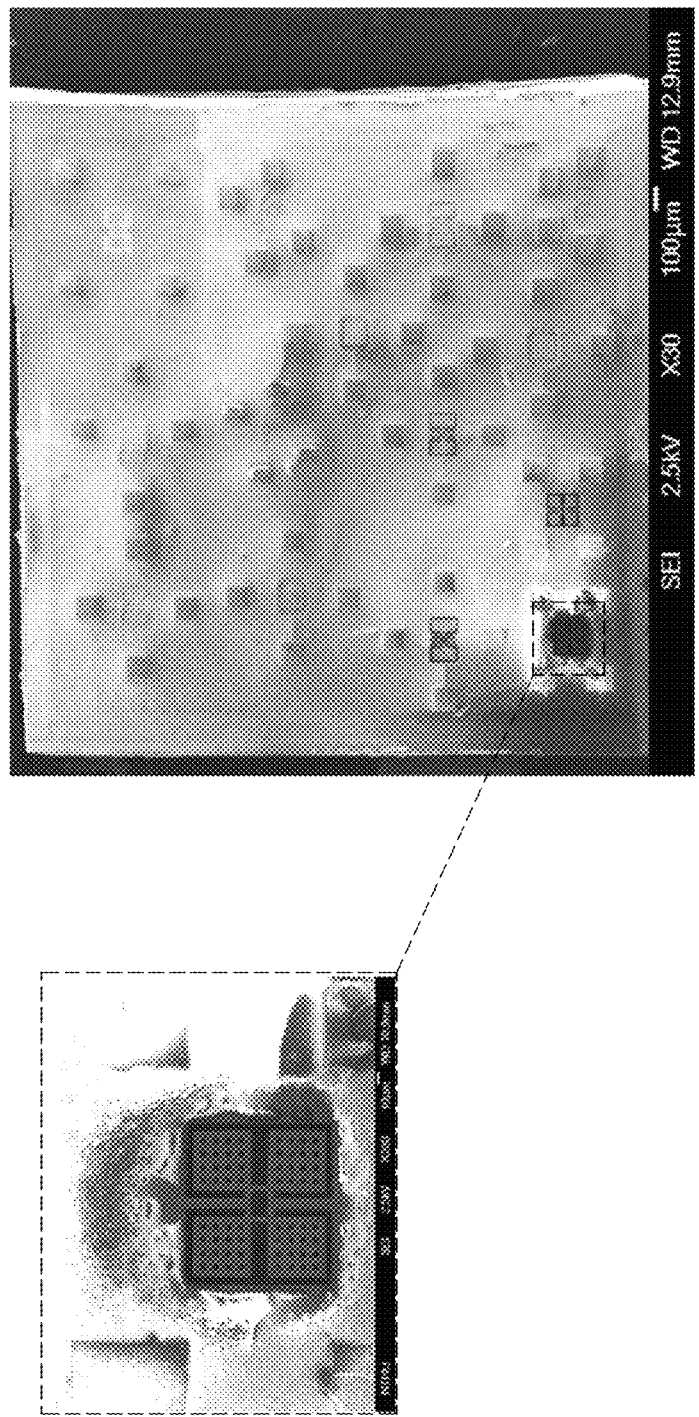
FIG. 18 shows an SEM image of a thermal-piezoresistive resonator of a comparative embodiment.

FIG. 17 shows one SEM image of a thermal-piezoresistive resonator 400 of the aerosol sensing method 100 of FIG. 15. FIG. 18 shows an SEM image of a thermal-piezoresistive resonator of a comparative embodiment. In the comparative embodiment, the thermal-piezoresistive oscillator-based aerosol sensor is identical to the thermal-piezoresistive oscillator-based aerosol sensor 200 of the present disclosure and includes a thermal-piezoresistive resonator 400, but the thermal-piezoresistive oscillator-based aerosol sensor is not operated by the aerosol sensing method 100 of the present disclosure. That is, the thermal-piezoresistive oscillator-based aerosol sensor of the comparative embodiment is driven continuously. As shown in FIG. 17, the particulate matters cover a surface of the thermal-piezoresistive resonator 400 uniformly. The thermal-piezoresistive resonator 400 of the comparative embodiment is not covered by the particulate matters, as shown in FIG. 18, and a protected area which is not covered by the particulate matters is formed owing to the thermophoresis effect; as a result, the particulate matters cannot be sensed. Therefore, through the comparison of the landing conditions in FIGS. 17 and 18, it is proved that operating the particle collecting process and the measuring process in a repetitive cycle to enable and disable the thermal-piezoresistive resonator 400 has a better collecting effect such that the particulate matters can be sensed.

Figure 19:
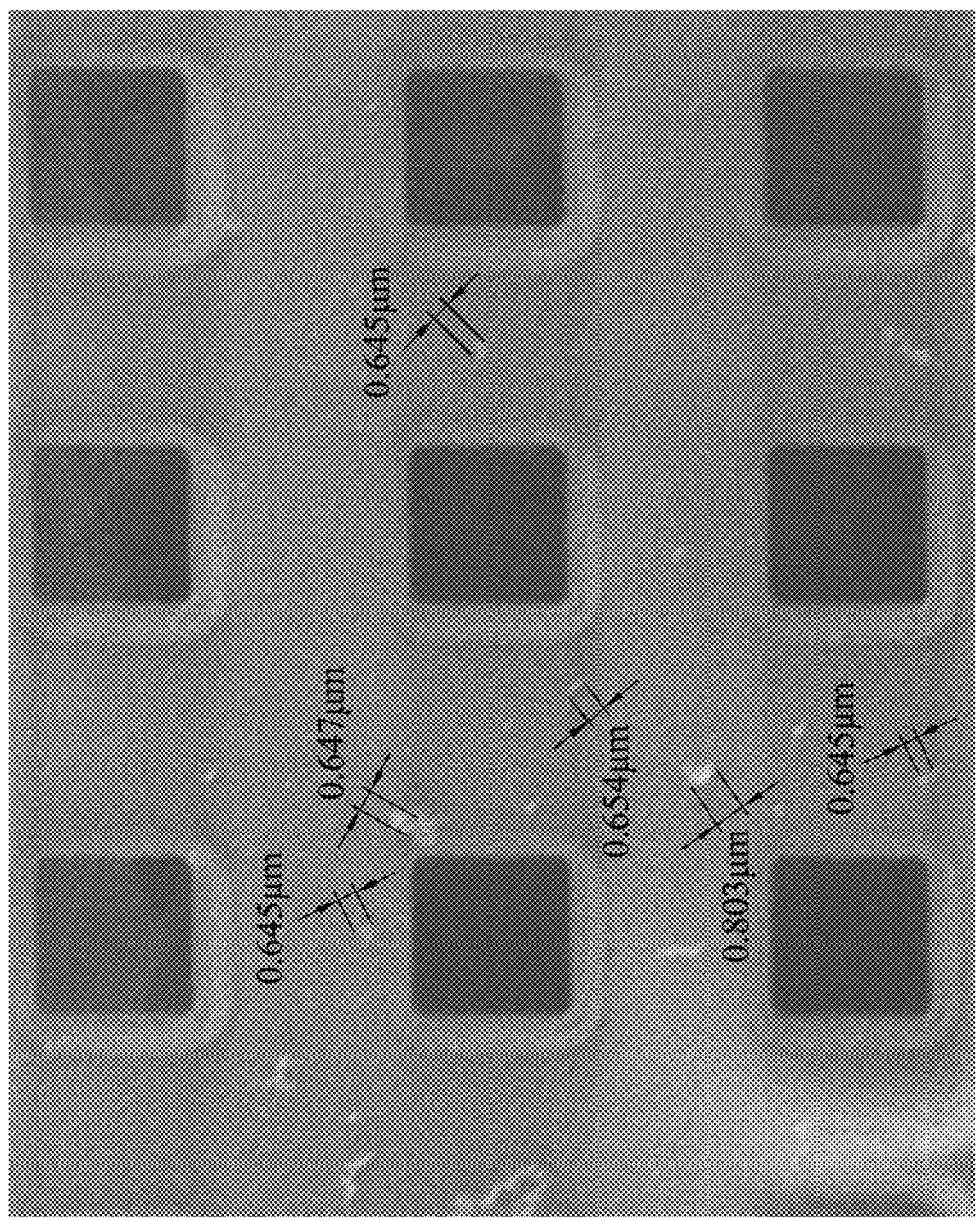
FIG. 19 shows another SEM image of the thermal-piezoresistive resonator of the aerosol sensing method of FIG. 15.

FIG. 19 shows another SEM image of the thermal-piezoresistive resonator 400 of the aerosol sensing method 100 of FIG. 15. As shown in FIG. 19, particulate matters with a diameter less than 1 μm can land on the proof-mass 420 because the thermophoresis effect is regulated owing to the aerosol sensing method 100; hence, the aerosol sensing method 100 can improve the sensing ability of the thermal-piezoresistive oscillator-based aerosol sensor.

Figure 20:
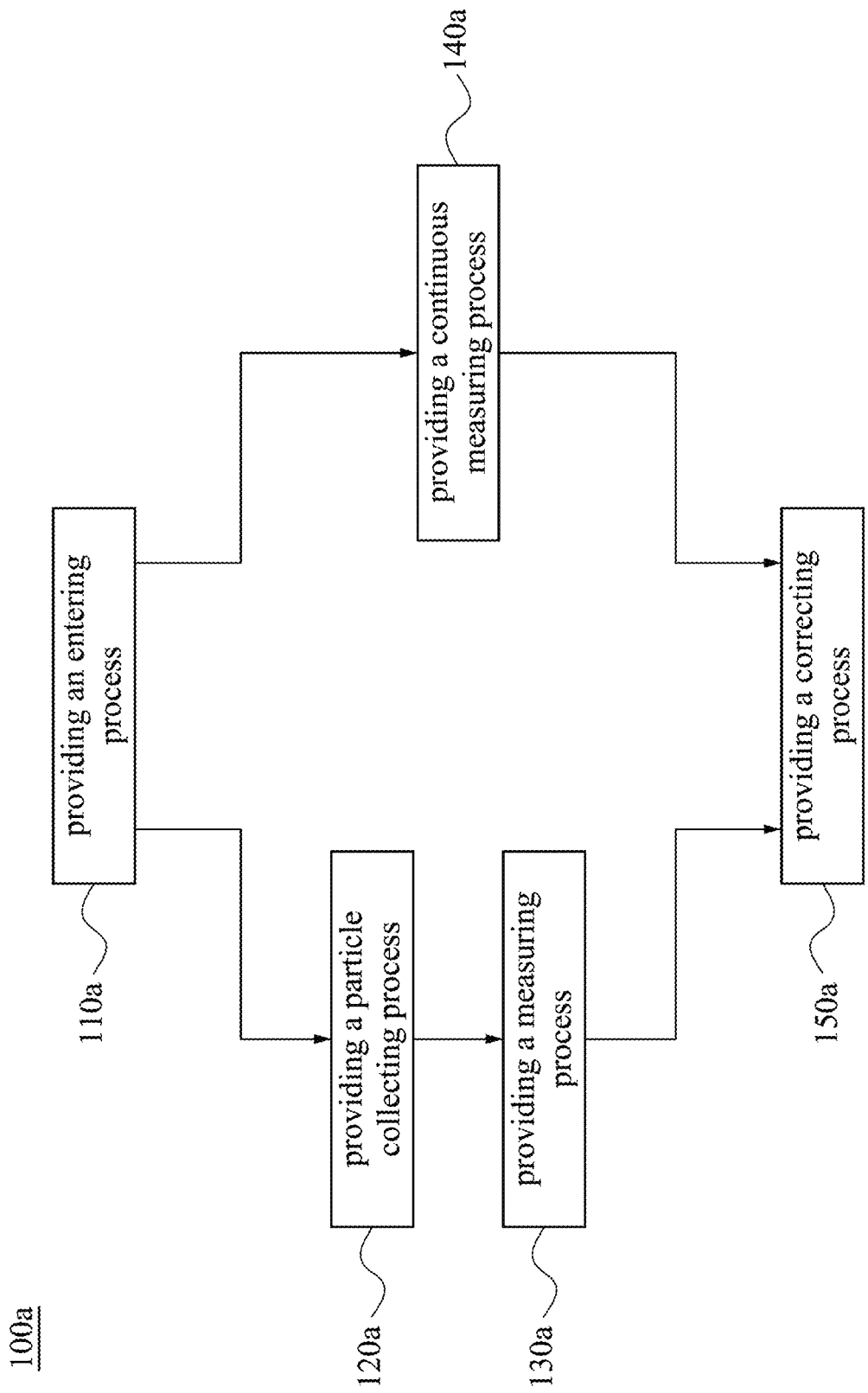
FIG. 20 shows a flow chart of an aerosol sensing method according to yet another embodiment of the present disclosure.

FIG. 20 shows a flow chart of an aerosol sensing method 100a according to yet another embodiment of the present disclosure. Refer to FIG. 20, the aerosol sensing method 100a includes Step 110a, Step 120a, Step 130a, Step 140a and Step 150a.

The Step 110a, Step 120a and Step 130a are similar to the Step 110, Step 120 and Step 130 of FIG. 15, and will not be described in details. The Step 140a and Step 150a are described below.

In Step 140a, a continuous measuring process is provided. A number of the thermal-piezoresistive resonator 400 is two. Continuously driving one of the thermal-piezoresistive resonators 400 to measure the changes of the resonant frequency thereof.

In Step 150a, a correcting process is provided to correct the resonant frequency of the thermal-piezoresistive resonator 400 operating in measuring process by the resonant frequency of the thermal-piezoresistive resonator 400 operating in the continuous measuring process.

Precisely, because the thermophoresis effect which will hinder the landing of the particulate matters occurs when the thermal-piezoresistive resonator 400 is driven, the particulate matters will not accumulate on the proof-mass 420; hence, the changes of the resonant frequency are mainly affected by the environment factors, such as moisture. Therefore, through continuous measuring process to get the changes of the resonant frequency affected by the environment factor, the thermal-piezoresistive resonator 400 operated in enable/disable operation can be corrected. The environment factor can be filtered by data processing such that precise sensing result of the concentration of the particulate matters can be obtained.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. An aerosol sensing method, comprising:
providing an entering process to allow an aerosol to enter a chamber of a thermal-piezoresistive oscillator-based aerosol sensor, wherein a thermal-piezoresistive resonator is disposed in the chamber;
providing a particle collecting process to allow particulate matters in the aerosol to land on at least one proof-mass of the thermal-piezoresistive resonator when the thermal-piezoresistive resonator is not driven; and
providing a measuring process to use an electrical signal to drive the thermal-piezoresistive resonator and measure a resonant frequency of the thermal-piezoresistive resonator;
wherein the particle collecting process and the measuring process are operated in a repetitive cycle for measuring changes of the resonant frequency of the thermal-piezoresistive resonator to measure the particulate matters of the aerosol.

2. The aerosol sensing method of claim 1,
wherein a number of the thermal-piezoresistive resonators is two, drive continuously a first one of the thermal-piezoresistive resonators to measure changes of its resonant frequency thereof, drive repetitively the second one of the thermal-piezoresistive resonators to measure changes of its resonant frequency thereof; and
provide correction to the measured resonant frequency of the second thermal-piezoresistive resonator by the measured resonant frequency of the first thermal-piezoresistive resonator.

3. A thermal-piezoresistive oscillator-based aerosol sensor, which is for measuring the particulate matters of the aerosol by using the aerosol sensing method of claim 1, comprising:
a case, comprising:
an opening; and
the chamber communicated with opening; and
the thermal-piezoresistive resonator disposed inside the chamber, the thermal-piezoresistive resonator comprising at least one thermal beam connected to the proof-mass, wherein the proof-mass is resonated when the thermal beam is driven.

4. The thermal-piezoresistive oscillator-based aerosol sensor of claim 3, wherein a number of the thermal beam is two, each of the thermal beams comprises a first end and a second end, and the thermal-piezoresistive resonator further comprises:
two mechanical beams perpendicular to the thermal beam, two ends of one of the mechanical beams connected between the first end of one of the thermal beams and the first end of the other one of the thermal beams, and two ends of the other mechanical beams connected between the second end of one of the thermal beams and the second end of the other one of the thermal beams such that a rectangle frame structure is formed;
wherein a number of the proof-mass is four, and the four proof-mass are connected between the two first ends and the two second ends of the two thermal beams, respectively.

5. The thermal-piezoresistive oscillator-based aerosol sensor of claim 4, wherein each of the thermal beams comprises:

a first oxide layer, comprising a first upper surface and a first lower surface opposite to the first upper surface;

a first lower layer disposed on the first lower surface and comprising:
  a first poly region; and
  two first metal regions, each of the first metal regions having a first distal end and a first proximate end, the two first proximate ends connected to two ends of the first poly region, respectively; and a first upper layer disposed at the first upper surface and comprising:
  a second poly region; and
  two second metal regions, each of the second metal regions having a second distal end and a second proximate end, the two second proximate ends connected to two ends of the second poly region, respectively.

6. The thermal-piezoresistive oscillator-based aerosol sensor of claim 5, wherein each of the mechanical beams comprises:

a second oxide layer, comprising a second upper surface and a second lower surface opposite to the second upper surface;

a second lower layer disposed on the second lower surface, two ends of the second lower layer connected to the two first distal ends, respectively; and a second upper layer disposed at the second upper surface, two ends of the second upper layer connected to the two second distal ends, respectively.

7. The thermal-piezoresistive oscillator-based aerosol sensor of claim 3, wherein the case further comprises:

an impactor, comprising a plurality of holes communicated with the opening.

8. The thermal-piezoresistive oscillator-based aerosol sensor of claim 3, wherein each of the proof-mass further comprises a plurality of through holes spaced apart from each other.

\* \* \* \* \*